(12) United States Patent
Vyas et al.

(10) Patent No.: US 11,152,051 B1
(45) Date of Patent: Oct. 19, 2021

(54) REAL TIME MEMORY INTERFACE VARIATION TRACKING

(71) Applicant: Xilinx, Inc., San Jose, CA (US)

(72) Inventors: Amit Vyas, Hyderabad (IN); Ramakrishna Reddy Gaddam, Hyderabad (IN); Karthikeyan Palanisamy, Coimbatore (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/937,184

(22) Filed: Jul. 23, 2020

(51) Int. Cl.
| | | |
|---|---|---|
| *G11C 8/00* | (2006.01) | |
| *G11C 11/4076* | (2006.01) | |
| *G11C 7/22* | (2006.01) | |
| *G11C 7/10* | (2006.01) | |
| *G11C 11/4093* | (2006.01) | |
| *G11C 11/4096* | (2006.01) | |
| *G06F 13/16* | (2006.01) | |
| *G11C 16/32* | (2006.01) | |

(52) U.S. Cl.
CPC .......... *G11C 11/4076* (2013.01); *G11C 7/222* (2013.01); *G11C 7/1072* (2013.01); *G11C 7/1078* (2013.01); *G11C 7/1093* (2013.01); *G11C 7/1096* (2013.01); *G11C 7/22* (2013.01); *G11C 11/4093* (2013.01); *G11C 11/4096* (2013.01); *G11C 16/32* (2013.01)

(58) Field of Classification Search
CPC . G11C 11/4076; G11C 7/1072; G11C 7/1078; G11C 7/1093; G11C 7/1096; G11C 7/222; G11C 7/22; G11C 11/4093; G11C 11/4096; G11C 16/32
USPC ............ 365/193, 233.1, 233.13, 189.07, 149
See application file for complete search history.

(56) References Cited

U.S. PATENT DOCUMENTS

| | | | |
|---|---|---|---|
| 2005/0141331 A1* | 6/2005 | Cho ...................... | G11C 7/1078 365/233.1 |
| 2011/0298511 A1* | 12/2011 | Swanson ............... | G11C 7/1093 327/160 |

\* cited by examiner

*Primary Examiner* — Ly D Pham
(74) *Attorney, Agent, or Firm* — Amir Taborrok, Rimon Law Firm

(57) ABSTRACT

A method includes receiving a first and a second data from a first and second IO pad on a first and second data lines respectively. A data strobe is received from a third IO pad on a data strobe line. The first data and the second data are strobed based on the data strobe to generate a first and second strobed data. The first data from the first IO is received at the data strobe line and strobed based on the data strobe to form an another first strobed data and compared to the first strobed data to generate a comparison signal indicating whether adjustment to a delay of the first data line is needed. A delay command is generated to increase/decrease the delay of the first and second data line.

20 Claims, 8 Drawing Sheets

US 11,152,051 B1

REAL TIME MEMORY INTERFACE VARIATION TRACKING

TECHNICAL FIELD

The disclosure generally relates to tracking variation in real time and correcting skew, particularly on the receiver path of a source synchronous interface.

BACKGROUND

Typically, an interface is calibrated before enabling data to be sent or received, e.g., in a memory interface application. The calibration occurs such that the data received through a data line is sampled using data strobes with proper setup and hold margins.

Unfortunately, at higher frequencies the margins are less and the interface may additionally suffer from voltage and temperature variations over time, which leads to data degradation and data integrity failure. Traditionally, the data traffic is stopped and the interface is recalibrated and the margin is checked (which adds unnecessary overhead for performing read and write to the main application, e.g., application context in memory) after a period of time or the frequency is reduced. Unfortunately, the traditional solutions result in lower efficiency and more delay.

SUMMARY

Accordingly, it is desirable to track variations in real time without having to stop data traffic, without having to reduce the frequency, and without impacting the data throughput. The embodiments track variations in real time and run in the background without interfering with user traffic. The embodiments continuously correct delay(s) and adjust the margins based on the variations that are being tracked, e.g., the margins are tracked and corrected when needed. Accordingly, the embodiments achieve a higher interface speed in comparison to the traditional systems without adversely impacting the system efficiency.

In some embodiments, a system includes a first data line, a second data line, a differential data strobe line, a comparator, and a tracker and corrector circuitry. The first data line comprises a first input/output (IO) pad, a first delay line, and a first strobing unit, wherein the first IO pad is configured to receive a first data. The second data line comprises a second IO pad, a second delay line, and a second strobing unit, wherein the second IO pad is configured to receive a second data. The differential data strobe line comprises a first, a second, a third data strobe lines, and a clock gate. The first data strobe line comprises a first data strobe IO pad configured to receive a first data strobe, a first delay data strobe line, and a third strobing unit. The second data strobe line comprises a second data strobe IO pad configured to receive a second data strobe, a second delay data strobe line, and a fourth strobing unit, wherein the first and the second data strobe lines form the differential data strobe. The third data strobe line comprises a differential buffer configured to receive the first and the second data strobes from the first and second data strobe IOs respectively and to output a single ended signal. The clock gate is configured to receive the single ended signal and to clock the first, the second, the third, and the fourth strobing units based on the single ended signal. The first and the second data strobe lines are each configured to receive the first data from the first IO pad, and wherein the third and fourth strobing units strobe the first data to form a left margin and a right margin of a data region respectively. The comparator is configured to receive the left margin, the right margin, and the strobed first data from the first data line and further configured to output a comparison signal. The tracker and corrector circuitry unit is configured to receive the comparison signal and outputs a first delay command signal to adjust a delay of the first delay data strobe line to adjust the left margin, wherein the tracker and corrector circuitry unit is further configured to output a second delay command signal to adjust a delay of the second delay data strobe line to adjust the right margin, and wherein the tracker and corrector circuitry unit is further configured to output a third delay command signal to adjust a delay of the first and the second delay lines.

In some embodiments, the comparison signal indicates whether an adjustment to the delay of the first delay line should be made to strobe a valid data region. According to one nonlimiting example, the first data, the second data, the first data strobe, and the second data strobe are received from a source synchronous interface. In some embodiments, the system further includes a memory controller configured to receive the strobed first data from the first data line and to receive the strobed second data from the second data line.

According to some embodiments, the first data strobe line comprises a multiplexer configured to receive the first data strobe and is further configured to receive the first data from the first IO pad, and wherein the multiplexer is configured to output the first data from the first IO pad to the third strobing unit. In one nonlimiting example, the second data strobe line comprises a multiplexer configured to receive the second data strobe and is further configured to receive the first data from the first IO pad, and wherein the multiplexer is configured to output the first data from the first IO pad to the fourth strobing unit.

It is appreciated that the tracker and corrector circuitry is configured to increase or decrease the delay of the first delay data strobe line using the first delay command signal to adjust the left margin to strobe a valid data region, and wherein the first delay command signal is generated responsive to the comparison signal indicating that the left margin strobes an invalid data region. In some embodiments, the tracker and corrector circuitry is configured to increase or decrease the delay of the second delay data strobe line using the second delay command signal to adjust the right margin to strobe a valid data region, and wherein the second delay command signal is generated responsive to the comparison signal indicating that the right margin strobes an invalid data region. Moreover, in some embodiments, the tracker and corrector circuitry is configured to increase or decrease the delay of the first and the second delay lines using the third delay command signal, and wherein the third delay command signal is generated based on whether adjustment to the left or the right margin is made.

According to some embodiments a system includes a first data line, a second data line, a data strobe line, a comparator, and a tracker and corrector circuitry unit. The first data line includes a first IO pad, a first delay line, and a first strobing unit, wherein the first IO pad is configured to receive a first data. The second data line includes a second IO pad, a second delay line, and a second strobing unit, wherein the second IO pad is configured to receive a second data. The data strobe line includes a data strobe IO pad and a clock gate, wherein the data strobe IO pad is configured to receive a data strobe and wherein the clock gate is configured to clock the first and the second strobing units based on the received data strobe. It is appreciated that the data strobe line is further configured to receive the first data from the first IO pad, and wherein a strobing unit of the data strobe line is clocked using the clock gate and strobes the first data. The comparator is configured to receive the strobed first data from the data strobe line, to receive the strobed first data from the first data line, and to output a comparison signal. The tracker and corrector circuitry unit is configured to receive the comparison signal and output a delay command signal to adjust a delay of the first delay line, wherein the delay command signal further adjusts a delay of the second delay line.

According to some embodiments, the comparison signal indicates whether an adjustment to the delay of the first delay line should be made to strobe a valid data region. In some nonlimiting examples, the first data, the second data, and the data strobe are received from a source synchronous interface.

According to some embodiments, the first strobing unit strobes the first data to generate the first strobed data and the second strobing unit strobes the second data to generate the second strobed data. It is appreciated that the system may include a memory controller configured to receive the first strobed data and the second strobed data.

In some embodiments, the data strobe line includes a multiplexer configured to receive the data strobe and is further configured to receive the first data from the first IO pad, and wherein the multiplexer is configured to output the first data from the first IO pad to the strobing unit of the data strobe line. It is appreciated that in some embodiments, the tracker and corrector circuitry is configured to increase or decrease the delay of the first delay line using the delay command signal.

In some embodiments, a method includes receiving a first data from a first IO pad on a first data line. The method also includes receiving a second data from a second IO pad on a second data line. The method further includes receiving a data strobe from a third IO pad, wherein the third IO pad is on a data strobe line. In some embodiments, the method further includes strobing the first data and the second data based on the data strobe to generate a first strobed data and a second strobed data. According to some embodiments, the method also includes receiving the first data from the first IO at the data strobe line and strobing the first data based on the data strobe to form an another first strobed data. It is appreciated that the first strobed data is compared with the another first strobed data to generate a comparison signal indicating whether adjustment to a delay of the first data line is needed. Responsive to the comparison signal a delay command is generated to increase or decrease the delay of the first data line. The method also includes increasing or decreasing a delay of the second data line by a same delay as the first data line based on the delay command.

It is appreciated that the data strobe comprises a differential strobe signal. The method further includes generating a single ended signal based on the differential strobe signal, wherein the first data and the second data are each strobed using the single ended signal. The method also includes transmitting the first and the second strobed data to a memory controller.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
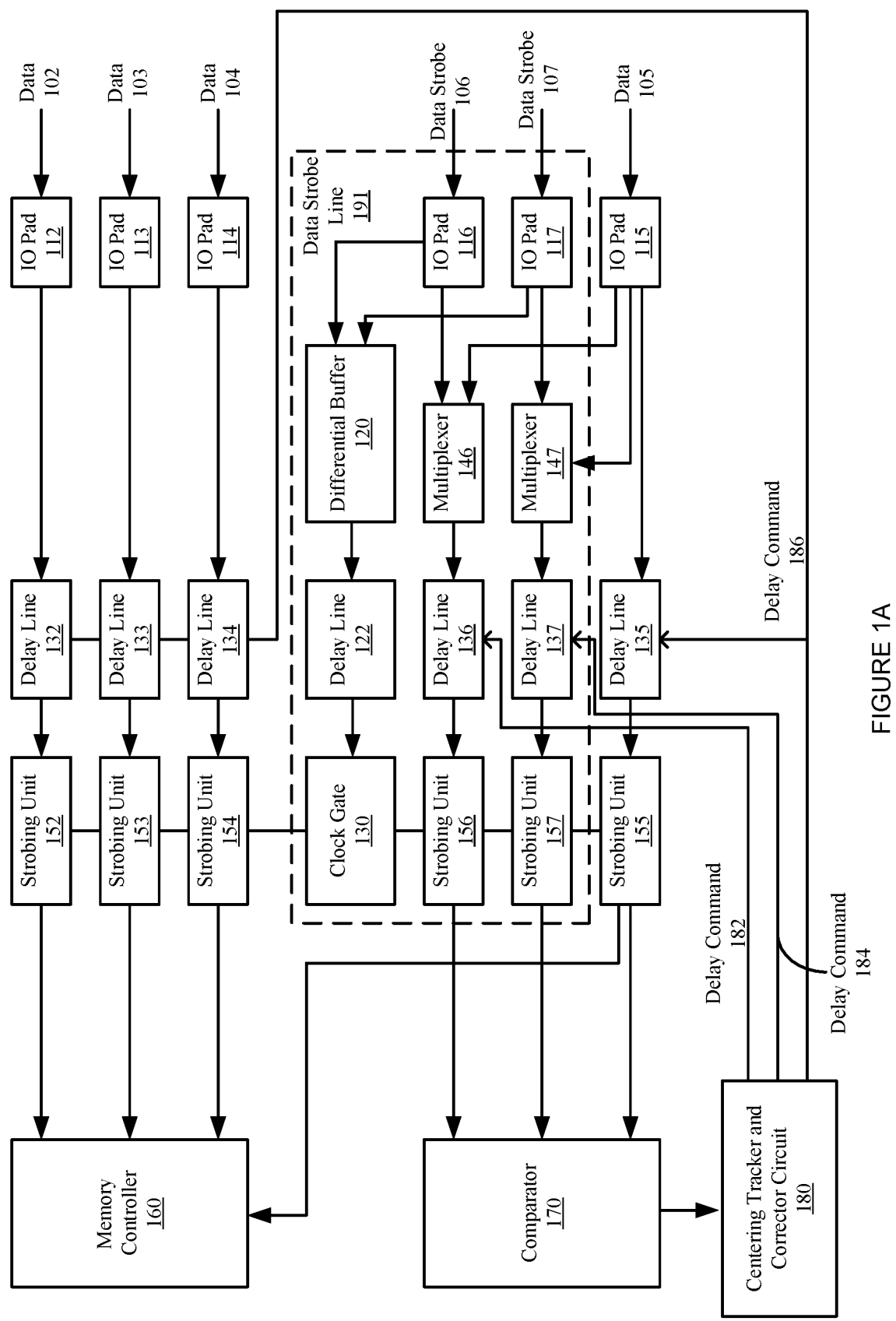
FIG. 1A shows a system for tracking and correcting skew in a differential system in real time, according to some examples.

Examples described herein relate to a system for tracking variations in real time without having to stop data traffic, without having to reduce the frequency, and without impacting the data throughput. The embodiments track variations, e.g., in voltage and temperature, in real time and run in the background without interfering with user traffic. The embodiments, continuously correct delay(s) and adjust margins based on the variations that are being tracked, e.g., the margins are tracked and corrected when needed. Accordingly, the embodiments achieve a higher interface speed in comparison to the traditional systems without adversely impacting the system efficiency.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. For example, various methods according to some examples can include more or fewer operations, and the sequence of operations in various methods according to examples may be different than described herein. In addition, an illustrated example need not have all the aspects or advantages shown. An aspect or an advantage described in conjunction with a particular example is not necessarily limited to that example and can be practiced in any other examples even if not so illustrated or if not so explicitly described.

Some general concepts will first be described to clarify terms and nomenclature used throughout this description.

FIG. 1A shows a system for tracking and correcting skew in a differential system in real time, according to some examples. The embodiments as described are directed to a memory interface and more specifically to a source synchronous interface. It is appreciated that the embodiments are described in relation to a dynamic random access memory (DRAM) accesses such as double data rate (DDR) DRAM but the embodiments should not be construed as limited thereto.

Figure 2:
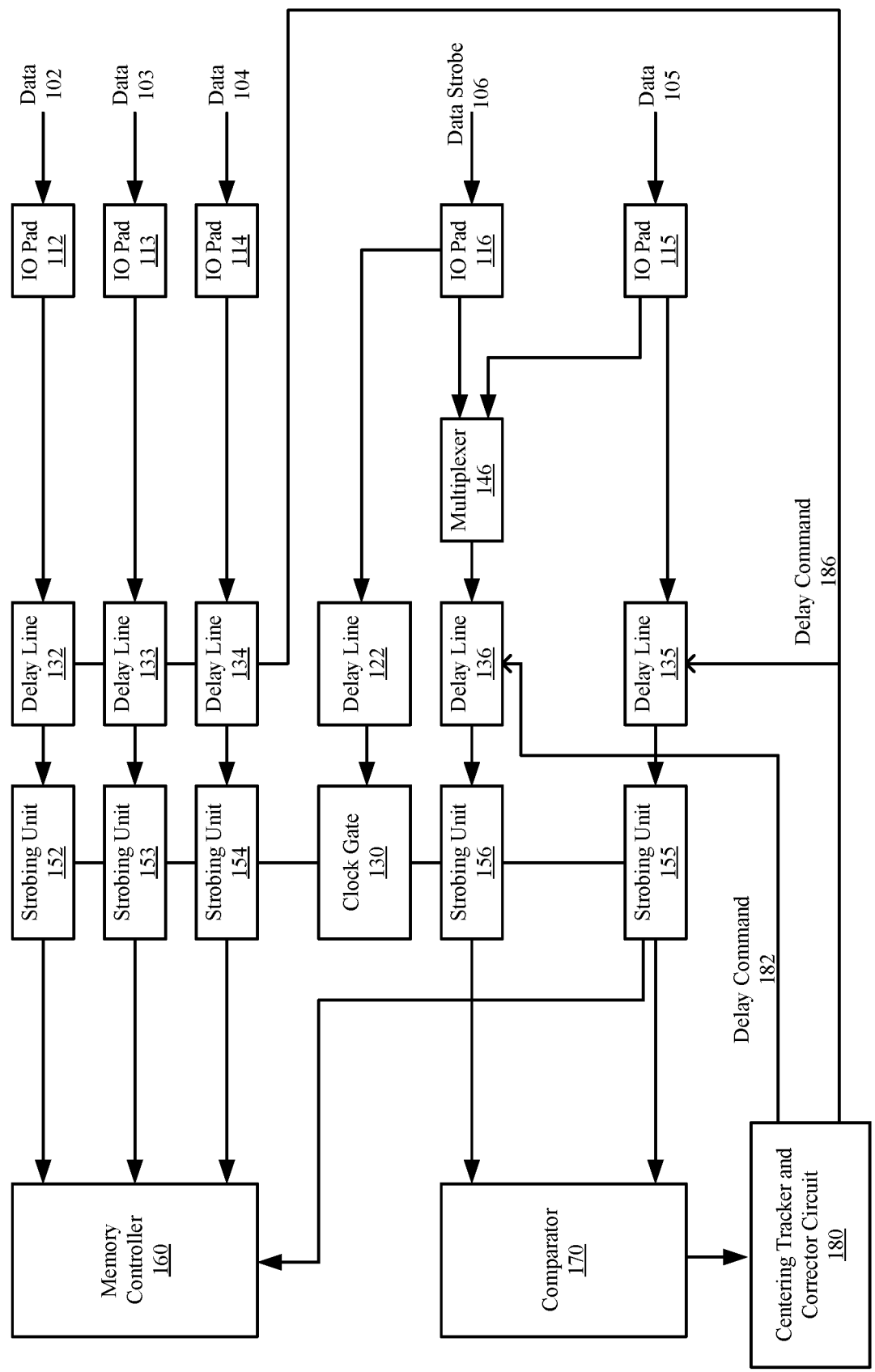
FIG. 2 shows a system for tracking and correcting skew in a single ended system in real time, according to some examples.

In this embodiment, the DRAM access is through four data lines and one data strobe line. For example, data 102 is received through a first data line, data 103 is received through a second data line, data 104 is received through a third data line, and data 105 is received through a fourth data line, while a differential data strobe (i.e. data strobe 106 and data strobe 107) is received through a data strobe line 191. It is appreciated that while some embodiments are described with respect to a differential data strobe, for illustrative purposes, the embodiments should not be construed as limited thereto. For example, a non-differential data strobe may be used (as shown in FIG. 2).

In some embodiments, data 102 is received at IO pad 112 on the first data line. Generally, data 102 goes through some delay, e.g., delay line 132 on the first data line. Similarly, data 103 is received at IO pad 113 on the second data line and goes through delay line 133. Data 104 is received at IO pad 114 on the third data line and goes through delay line 134. Data 105 is received at IO pad 115 on the fourth data line and goes through delay line 135. It is appreciated that the four data lines are associated with one differential data strobe in this embodiment. The differential data strobes 106 and 107 are received at IO pads 116 and 117 respectively. It is appreciated that data 102-105 and the data strobes 106-107 are initiated and transmitted by the same source, hence source synchronous in one embodiment. However, once data 102-105 and data strobes 106-107 are received, they may undergo different voltage and/or temperature variation on the chip, e.g., the data 102-105 may undergo a different path from that of data strobes 106-107 once received, causing data degradation and data failure.

The data strobes 106-107 form a differential line by being direct and inverted lines of one another. The data strobes 106-107 are fed into the differential buffer 120 to form a single ended signal that undergoes a delay line 122 to the clock gate 130. The clock gate 130 clocks the strobing units for each data line based on the received single ended signal. For example, the clock gate 130 clocks the strobing unit 152 on the first data line such that data 102 is strobed. Similarly, the clock gate 130 clocks the strobing unit 153 on the second data line such that data 103 is strobed. The clock gate 130 clocks the strobing unit 154 on the third data line such that data 104 is strobed while it clocks the strobing unit 155 on the fourth data line such that data 105 is strobed. The strobed data is then transmitted to the memory controller 160. In other words, data 102 after it is subject to some delay is strobed and transmitted to the memory controller 160. Similarly, data 103 after it is subject to some delay is strobed, data 104 after it is subject to some delay is strobed, and data 105 after it is subject to some delay is strobed, and are all transmitted to the memory controller 160.

As discussed above, data strobes and the received data may undergo different paths within a chip once they are received and therefore may be subject to different voltage and/or temperature, causing data degradation and data failure over time. In order to correct for the variations and modify the hold margin, the setup and hold margin of one of the data lines is tracked, e.g., the fourth data line. It is presumed that all data lines are subject to similar variations and as such tracking one data line is representative of other data lines as well. In this illustrative embodiment, the fourth data line is used to track variations. However, it is appreciated that any of the data lines may be used and use of the fourth data line is for illustrative purposes and should not be construed as limiting the scope of the embodiments.

Accordingly, data 105 received at IO pad 115 is transmitted to the data strobe line 191. For example, the data 105 is sent to multiplexers 146 and 147 of the data strobe line 191. The multiplexer 146 is associated with data strobe 106 and the multiplexer 147 is associated with data strobe 107. The multiplexer 146 receives the data strobe 106 from IO pad 116 and the data 105 from the IO pad 115. The multiplexer 146 selects the data 105 as output to the delay line 136. Similarly, the multiplexer 147 receives the data strobe 107 from IO pad 117 and the data 105 from the IO pad 115. The multiplexer 147 selects the data 105 as output to the delay line 137. The data 105 goes through some delay, e.g., delay of delay lines 136 and 137 associated with data strobes 106 and 107 respectively, and is output to strobing units 156 and 157 associated with data strobes 106 and 107 respectively. The strobing units 156 and 157 are also clocked with the clock gate 130 based on the data strobes 106 and 107 and the single ended signal. The strobing units 156 and 157 strobe data 105 on the data strobe line 191 and output the strobed signals to a comparator 170. The comparator 170 also receives the data 105 that is strobed on the fourth data line from the strobing unit 155.

The comparator 170 compares the strobed data to one another. For example, the comparator 170 compares data 105 that is strobed by strobing unit 155 to the output of the strobing unit 156 and also to the output of the strobing unit 157. The output of the strobing unit 156 may have a delay offset from that of data 105 that is strobed by strobing unit 155 to track the left margin. Similarly, the output of the strobing unit 157 may have a delay offset from that of data 105 that is strobed by strobing unit 155 to track the right margin.

The comparator 170 may output a comparison signal to the centering tracker and corrector circuit 180. The centering tracker and corrector circuit 180 tracks the left margin, the right margin, and the center of the strobe and determines whether any adjustment to the left margin, to the right margin, etc. needs to be made or is desired. The centering tracker and corrector circuit 180 may generate a delay command 182, 184, and 186 to adjust (increment/decrement delay offset) the left margin, adjust (increment/decrement delay offset) the right margin, and/or to adjust (increment/decrement delay offset) the delay on the data lines (i.e. the first, the second, the third, and the fourth data lines). It is appreciated that in some embodiments, the delay commands 182, 184, and 186 may be issued independent from one another. For example, the left margin may be adjusted without making adjustment to the right margin, the right margin may be adjusted without making adjustment to the left margin, etc. In some embodiments, determining whether adjustment to the delay of the data lines is desired may be based on whether any adjustment to the left/right margins is made.

Figure 1B:
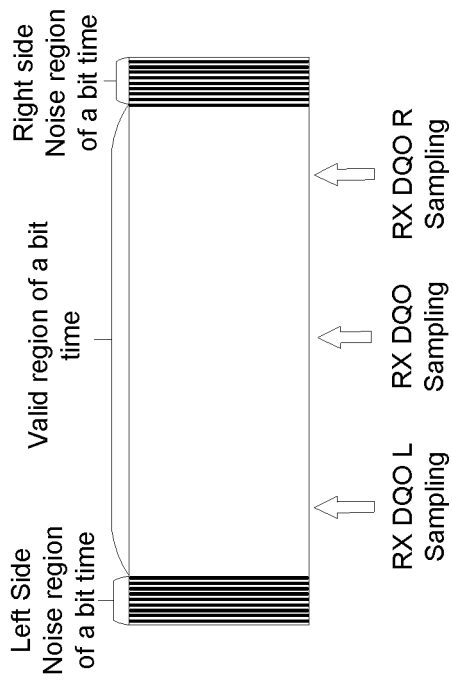
FIGS. 1B-1F show illustrative outputs associated with the left margin, the right margin, and the sampling strobing signal according to some examples.
Figure 1C:
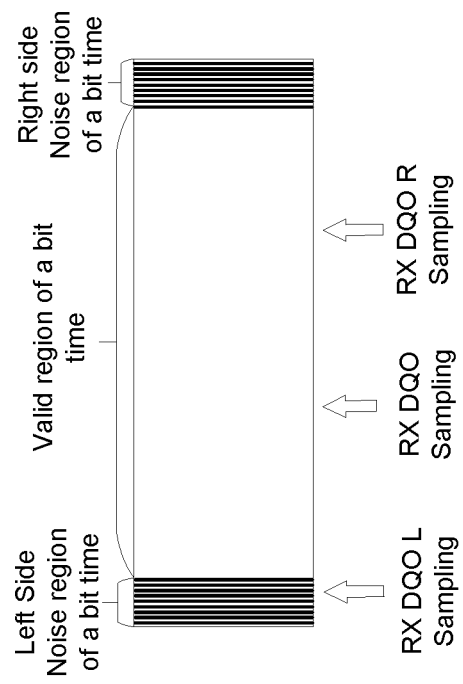
Figure 1D:
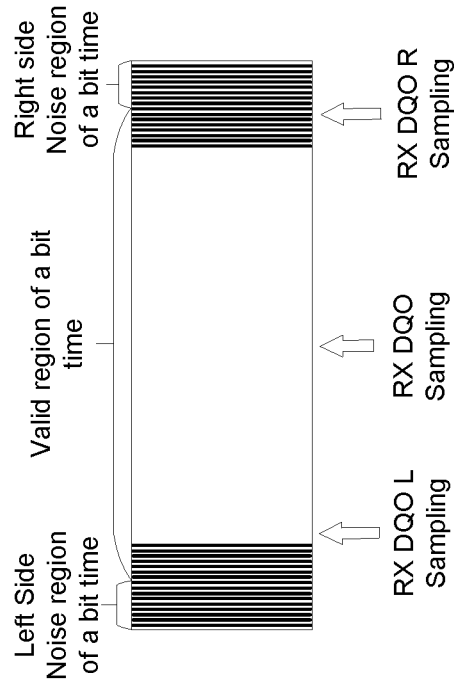
Figure 1E:
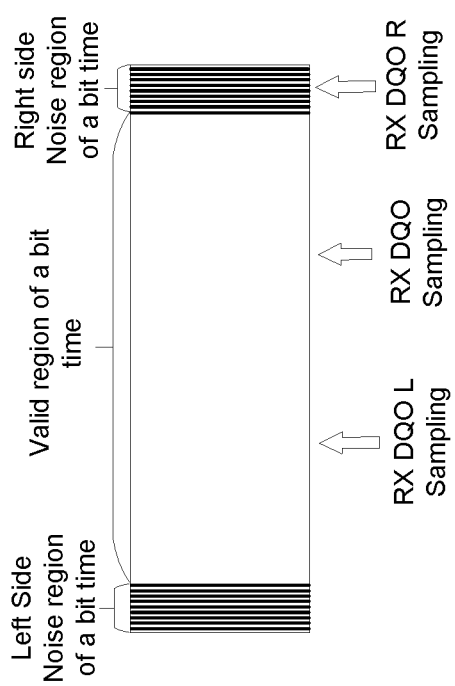
Figure 1F:
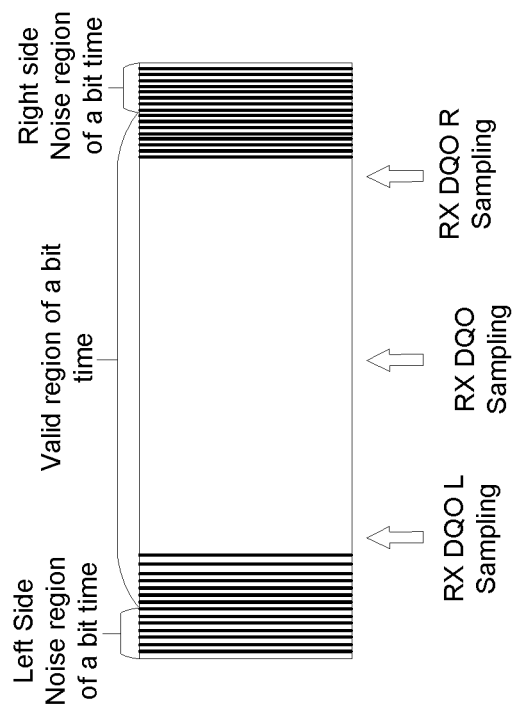

FIGS. 1B-1F show illustrative outputs associated with the left margin, the right margin, and the sampling strobing signal according to some examples. Referring now to FIG. 1B, strobing the data and its left and right margins are shown in one nonlimiting example. According to this nonlimiting example, the strobed data and its right and left margins are all within the valid region. Accordingly, it may be determined that no adjustment to the delay of the data lines or an adjustment to the margins may be needed. In contrast, referring to FIG. 1C, the strobed data and the right margin are within the valid region while the left margin samples noise. As such, a determination may be made that adjustments to the left margin may be needed. It is appreciated that in some embodiments, adjustment to the left margin may be applied to the strobing signal as well as the right margin. In other words, the delay applied to the left margin (i.e. shifting right) may be applied to the right margin and the center probing signal as well. However, in one nonlimiting example, the left margin may be adjusted without adjusting the right margin and/or the delay for the data strobe (i.e. delay on the data lines). In contrast, referring to FIG. 1D, the strobed data and the left margin are within the valid region while the right margin samples noise. As such, a determination may be made that adjustments to the right margin may be needed. It is appreciated that in some embodiments, adjustment to the right margin may be applied to the strobing signal as well as the left margin. In other words, the delay applied to the right margin (i.e. shifting left) may be applied to the left margin and the center probing signal as well. However, in one nonlimiting example, the right margin may be adjusted without adjusting the left margin and/or the delay for the data strobe (i.e. delay on the data lines). In contrast, referring to FIG. 1E, the strobed data is within the valid region while the left and right margins sample noise. As such, a determination may be made that adjustments to the left and the right margins may be needed. It is appreciated that in some embodiments, adjustment to the left margin and right margin may be the same (i.e. the left margin may be shifted right by the same amount as the right margin being shifted left) or may be independent from one another (e.g., the left margin may be shifted right by a different amount than the right margin being shifted left). In some examples, the data strobe signal may remain unchanged or depending on the right and left margin it may be adjusted (e.g., such that the data strobe signal strobes the middle point between the left and the right margins). In contrast, referring to FIG. 1F, the strobed data and the left margin are within the valid region while the right margin samples noise. However, the left margin may be too close to the noise region. As such, a determination may be made that adjustments to the left margin as well as adjustment to the right margin may be needed. It is appreciated that in some embodiments, adjustment to the left margin and right margin may be the same (i.e. the left margin may be shifted right by the same amount as the right margin being shifted left) or may be independent from one another (e.g., the left margin may be shifted right by a different amount than the right margin being shifted left). In some examples, the data strobe signal may remain unchanged or depending on the right and left margin it may be adjusted (e.g., such that the data strobe signal strobes the middle point between the left and the right margins).

It is appreciated that the adjustments may be made by incrementing or decrementing delay for the left margin, the right margin, and/or delay of the data lines. In some embodiments, the delay commands continuously increment/decrement delays as needed for the left margin, the right margin, and the delay on the data line until a desired performance is achieved.

FIG. 2 shows a system for tracking and correcting skew in a single ended system in real time, according to some examples. FIG. 2 is substantially similar to that of FIG. 1A and operates similar thereto. However, in the nonlimiting example of FIG. 2, the data strobe line is not a differential strobe line. As such, data strobe 106 is received at IO pad 116. Since the data strobe is not a differential strobe line, a differential buffer 120, as discussed in FIG. 1A, is not needed. Thus, data strobe 106 is transmitted from the IO pad 116 to the delay line 122 since it is single ended. Moreover, it is appreciated that since a single data strobe 106 is received, a left margin and right margin, both tracked in time multiplexed fashion (i.e. in one time instance the delays are loaded for the left margin, and at another time instance the delays are loaded for the right margin), as an example.

Figure 3:
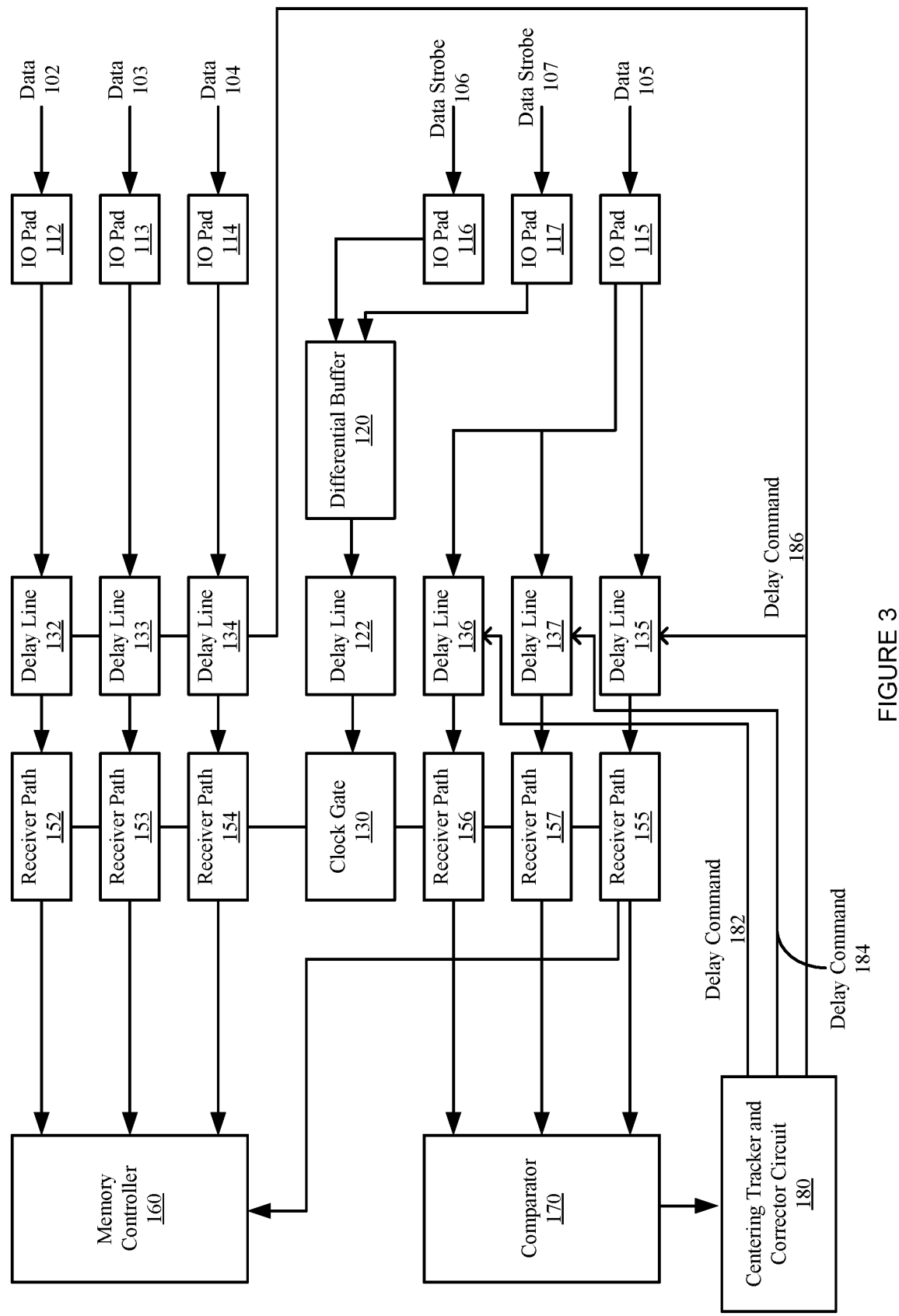
FIG. 3 shows another system for tracking and correcting skew in real time, according to some examples.

FIG. 3 shows another system for tracking and correcting skew in real time, according to some examples. FIG. 3 is substantially similar to that of FIG. 1A and operates similar to that of FIG. 1A. In this nonlimiting example, however, the data 105 is fed directly from IO pad 115 to the delay lines 136 and 137 associated with the data strobe line 191 without a need to be connected using a multiplexer. The embodiment of FIG. 1A may be implemented in a programmable device, such as a field programmable gate array (FPGA) and as such connections may be made through existing multiplexers dispersed throughout the programmable chip. In contrast, the architecture of FIG. 3 may be implemented in an application specific integrated circuit (ASIC), thereby eliminating the need to use a multiplexer to connect data 105 received on IO pad 115 to the delay lines 136 and 137.

Figure 4:
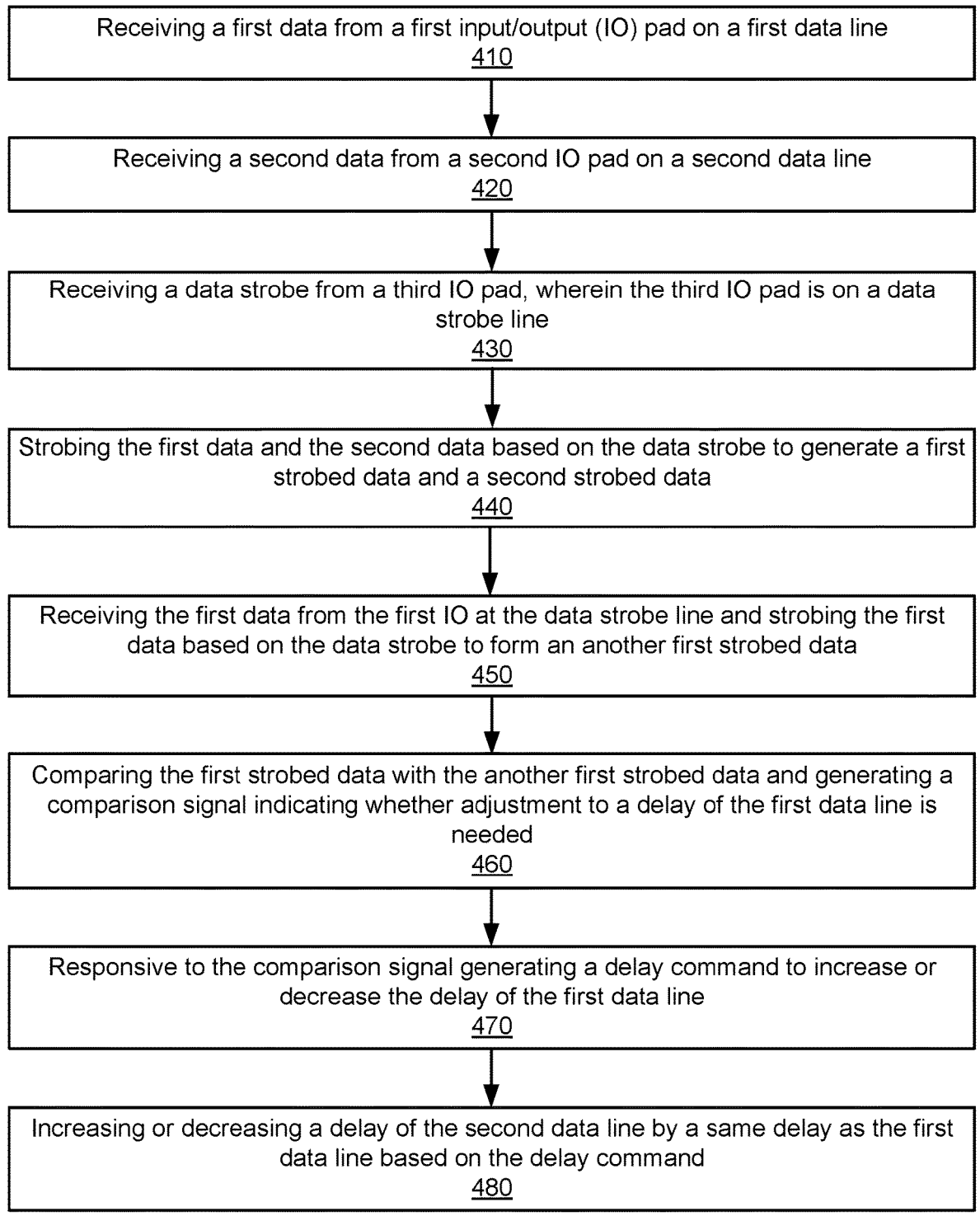
FIG. 4 shows a method of tracking and correcting skew in real time, according to some examples.

FIG. 4 shows a method of tracking and correcting skew in real time, according to some examples. At step 410, a first data from a first IO pad on a first data line is received, as described above with respect to FIGS. 1A, 2 and 3. At step 420, a second data from a second IO pad on a second data line is received, as described above. In some embodiments, at step 430, a data strobe from a third IO pad is received, as described in FIGS. 1A, 2, and 3. It is appreciated that the third IO pad is on a data strobe line. In some embodiments, at step 440 the first data and the second data are strobed based on the data strobe to generate a first strobed data and a second strobed data respectively, as described above. According to some embodiments, at step 450, the first data from the first IO is received at the data strobe line. The first data is strobed based on the data strobe to form an another first strobed data. It is appreciated that at step 460, the first strobed data is compared with another first strobed data to generate a comparison signal indicating whether adjustment to a delay of the first data line is needed. At step 470, responsive to the comparison signal a delay command is generated to increase or decrease the delay of the first data line, as described above in FIGS. 1A-3. In some embodiments, at step 480, the increasing or decreasing a delay of the second data line is by a same delay as the first data line based on the delay command.

It is appreciated that in some embodiments the data strobe comprises a differential strobe signal, as described in FIGS. 1A and 3. Accordingly, a single ended signal based on the differential strobe signal may be generated and the first data and the second data are each strobed using the single ended signal. It is appreciated that the first and the second strobed data are transmitted to a memory controller.

Figure 5:
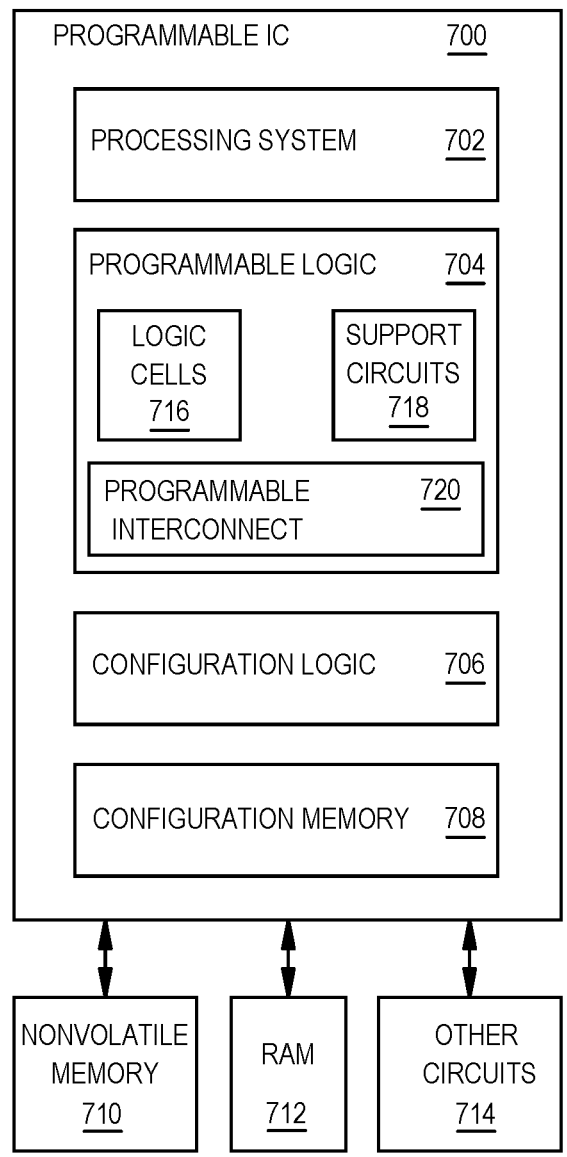
FIG. 5 is a block diagram depicting a programmable integrated circuit (IC), according to some examples.

FIG. 5 is a block diagram depicting a programmable integrated circuit (IC) 700 according to an example. The programmable IC 700 can implement the integrated circuit (IC) chip of systems of FIGS. 1-4, in whole or in part. The programmable IC 700 includes a processing system 702, programmable logic 704, configuration logic 706, and configuration memory 708. The programmable IC 700 can be coupled to external circuits, such as nonvolatile memory 710, RAM 712, and other circuits 714.

In the illustrated example, the processing system 702 can include microprocessor(s), memory, support circuits, IO circuits, and the like. The programmable logic 704 includes logic cells 716, support circuits 718, and programmable interconnect 720. The logic cells 716 include circuits that can be configured to implement general logic functions of a plurality of inputs. The support circuits 718 include dedicated circuits, such as transceivers, input/output blocks, digital signal processors, memories, and the like. The logic cells and the support circuits 718 can be interconnected using the programmable interconnect 720. Information for programming the logic cells 716, for setting parameters of the support circuits 718, and for programming the programmable interconnect 720 is stored in the configuration memory 708 by the configuration logic 706. The configuration logic 706 can obtain the configuration data from the nonvolatile memory 710 or any other source (e.g., the RAM 712 or from the other circuits 714).

Figure 6:
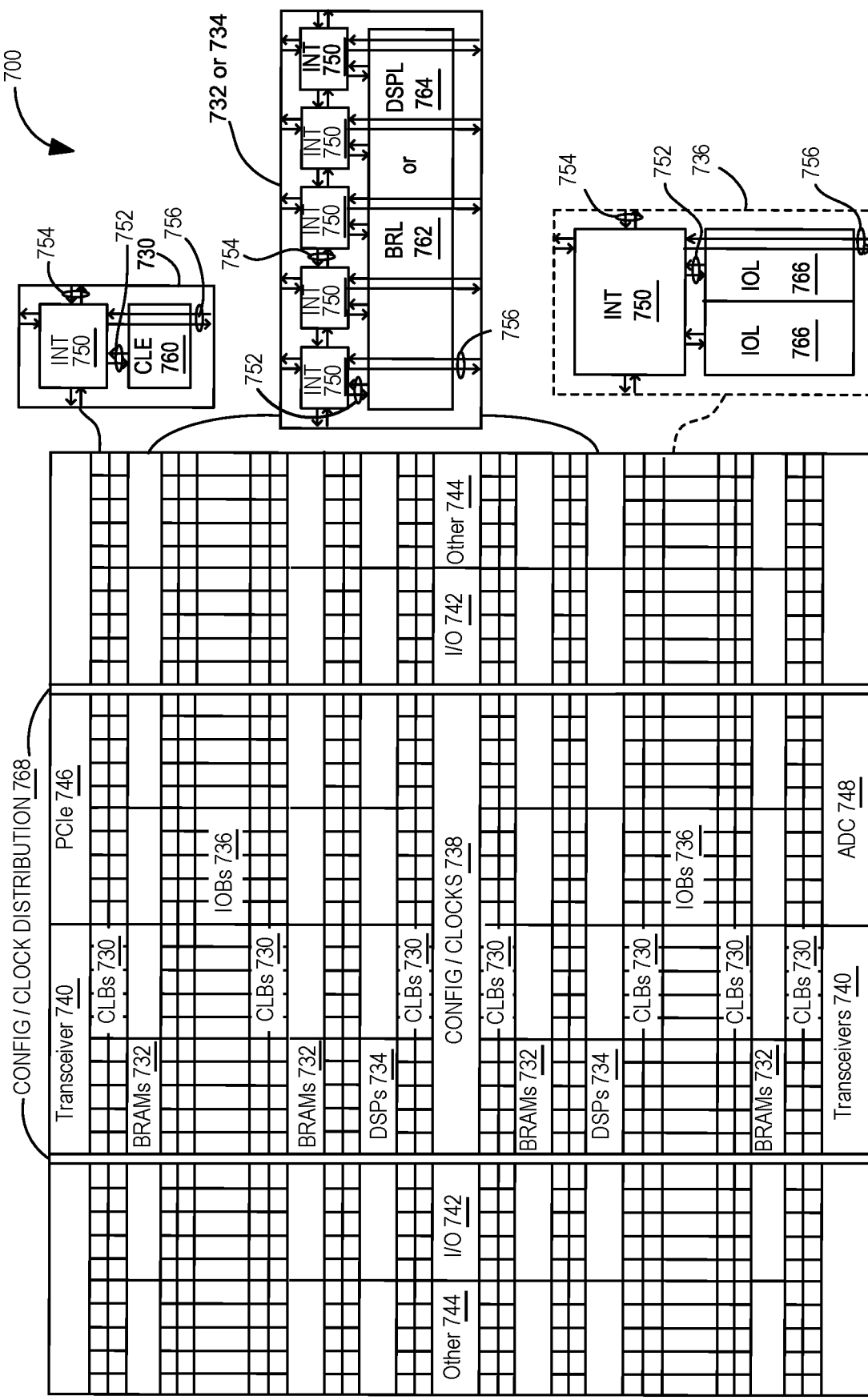
FIG. 6 is a field programmable gate array (FPGA) implementation of the programmable IC, according to some examples.

FIG. 6 illustrates an FPGA implementation of the programmable IC 700 that includes a large number of different programmable tiles including configurable logic blocks ("CLBs") 730, random access memory blocks ("BRAMs") 732, signal processing blocks ("DSPs") 734, input/output blocks ("IOBs") 736, configuration and clocking logic ("CONFIG/CLOCKS") 738, digital transceivers 740, specialized input/output blocks ("I/O") 742 (e.g., configuration ports and clock ports), and other programmable logic 744 such as digital clock managers, system monitoring logic, and so forth. The FPGA can also include PCIe interfaces 746, analog-to-digital converters (ADC) 748, and the like.

In some examples, each programmable tile in an FPGA can include at least one programmable interconnect element ("INT") 750 having connections to input and output terminals 752 of a programmable logic element within the same tile, as shown by examples included in FIG. 8. Each programmable interconnect element 750 can also include connections to interconnect segments 754 of adjacent programmable interconnect element(s) in the same tile or other tile(s). Each programmable interconnect element 750 can also include connections to interconnect segments 756 of general routing resources between logic blocks (not shown). The general routing resources can include routing channels between logic blocks (not shown) comprising tracks of interconnect segments (e.g., interconnect segments 756) and switch blocks (not shown) for connecting interconnect segments. The interconnect segments of the general routing resources (e.g., interconnect segments 756) can span one or more logic blocks. The programmable interconnect elements 750 taken together with the general routing resources implement a programmable interconnect structure ("programmable interconnect") for the illustrated FPGA.

In an example of implementation, a CLB 730 can include a configurable logic element ("CLE") 760 that can be programmed to implement user logic plus a single programmable interconnect element ("INT") 750. A BRAM 732 can include a BRAM logic element ("BRL") 762 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 734 can include a DSP logic element ("DSPL") 764 in addition to an appropriate number of programmable interconnect elements. An 10B 736 can include, for example, two instances of an input/output logic element ("IOL") 766 in addition to one instance of the programmable interconnect element 750. As will be clear to those of skill in the art, the actual I/O pads connected, for example, to the input/output logic element 766 typically are not confined to the area of the input/output logic element 766.

In the pictured example, a horizontal area near the center of the die is used for configuration, clock, and other control logic. Vertical columns 768 extending from this horizontal area or column are used to distribute the clocks and configuration signals across the breadth of the FPGA.

In some examples, FPGAs utilizing the architecture illustrated in FIG. 6 include additional logic blocks that disrupt the regular columnar structure making up a large part of the FPGA. The additional logic blocks can be programmable blocks and/or dedicated logic. Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A system comprising:
   a first data line comprising a first input/output (IO) pad, a first delay line, and a first strobing unit, wherein the first IO pad is configured to receive a first data;
   a second data line comprising a second IO pad, a second delay line, and a second strobing unit, wherein the second IO pad is configured to receive a second data;
   a differential data strobe line comprising:
      a first data strobe line comprising a first data strobe IO pad configured to receive a first data strobe, a first delay data strobe line, and a third strobing unit;
      a second data strobe line comprising a second data strobe IO pad configured to receive a second data strobe, a second delay data strobe line, and a fourth strobing unit, wherein the first and the second data strobe lines form a differential data strobe;
      a third data strobe line comprising a differential buffer configured to receive the first and the second data strobes from the first and second data strobe IO pads respectively and to output a single ended signal; and
      a clock gate configured to receive the single ended signal and to clock the first, the second, the third, and the fourth strobing units based on the single ended signal,
   wherein the first and the second data strobe lines are each configured to receive the first data from the first IO pad, and wherein the third and fourth strobing units strobe the first data to form a left margin and a right margin of a data region respectively;
   a comparator configured to receive the left margin, the right margin, and the strobed first data from the first data line and further configured to output a comparison signal; and
   a tracker and corrector circuitry unit configured to receive the comparison signal and outputs a first delay command signal to adjust a delay of the first delay data strobe line to adjust the left margin, wherein the tracker and corrector circuitry unit is further configured to output a second delay command signal to adjust a delay of the second delay data strobe line to adjust the right margin, and wherein the tracker and corrector circuitry unit is further configured to output a third delay command signal to adjust a delay of the first and the second delay lines.

2. The system of claim 1, wherein the comparison signal indicates whether an adjustment to the delay of the first delay line should be made to strobe a valid data region.

3. The system of claim 1, wherein the first data, the second data, the first data strobe, and the second data strobe are received from a source synchronous interface.

4. The system of claim 1 further comprising a memory controller configured to receive the strobed first data from the first data line and to receive the strobed second data from the second data line.

5. The system of claim 1, wherein the first data strobe line comprises a multiplexer configured to receive the first data strobe and is further configured to receive the first data from the first IO pad, and wherein the multiplexer is configured to output the first data from the first IO pad to the third strobing unit.

6. The system of claim 1, wherein the second data strobe line comprises a multiplexer configured to receive the second data strobe and is further configured to receive the first data from the first IO pad, and wherein the multiplexer is configured to output the first data from the first IO pad to the fourth strobing unit.

7. The system of claim 1, wherein the tracker and corrector circuitry unit is configured to increase or decrease the delay of the first delay data strobe line using the first delay command signal to adjust the left margin to strobe a valid data region, and wherein the first delay command signal is generated responsive to the comparison signal indicating that the left margin strobes an invalid data region.

8. The system of claim 1, wherein the tracker and corrector circuitry unit is configured to increase or decrease the delay of the second delay data strobe line using the second delay command signal to adjust the right margin to strobe a valid data region, and wherein the second delay command signal is generated responsive to the comparison signal indicating that the right margin strobes an invalid data region.

9. The system of claim 1, wherein the tracker and corrector circuitry unit is configured to increase or decrease the delay of the first and the second delay lines using the third delay command signal, and wherein the third delay command signal is generated based on whether adjustment to the left or the right margin is made.

10. A system comprising:
a first data line comprising a first input/output (IO) pad, a first delay line, and a first strobing unit, wherein the first IO pad is configured to receive a first data;
a second data line comprising a second IO pad, a second delay line, and a second strobing unit, wherein the second IO pad is configured to receive a second data;
a data strobe line comprising a data strobe IO pad configured to receive a data strobe and clock the first and the second strobing units based on the received data strobe, wherein the data strobe line is further configured to receive the first data from the first IO pad and strobes the first data based on the received data strobe;
a comparator configured to receive the strobed first data from the data strobe line, to receive the strobed first data from the first data line, and to output a comparison signal; and a tracker and corrector circuitry unit configured to receive the comparison signal and output a delay command signal to adjust a delay of the first delay line, wherein the delay command signal further adjusts a delay of the second delay line.

11. The system of claim 10, wherein the comparison signal indicates whether an adjustment to the delay of the first delay line should be made to strobe a valid data region.

12. The system of claim 10, wherein the first data, the second data, and the data strobe are received from a source synchronous interface.

13. The system of claim 10, wherein the first strobing unit strobes the first data to generate the first strobed data and wherein the second strobing unit strobes the second data to generate the second strobed data.

14. The system of claim 13 further comprising a memory controller configured to receive the first strobed data and the second strobed data.

15. The system of claim 10, wherein the data strobe line comprises a multiplexer configured to receive the data strobe and is further configured to receive the first data from the first IO pad, and wherein the multiplexer is configured to output the first data from the first IO pad to a strobing unit of the data strobe line.

16. The system of claim 10, wherein the tracker and corrector circuitry is configured to increase or decrease the delay of the first delay line using the delay command signal.

17. A method comprising:
receiving a first data from a first input/output (IO) pad on a first data line;
receiving a second data from a second IO pad on a second data line;
receiving a data strobe from a third IO pad, wherein the third IO pad is on a data strobe line;
strobing the first data and the second data based on the data strobe to generate a first strobed data and a second strobed data;
receiving the first data from the first IO at the data strobe line and strobing the first data based on the data strobe to form an another first strobed data;
comparing the first strobed data with the another first strobed data and generating a comparison signal indicating whether adjustment to a delay of the first data line is needed;
responsive to the comparison signal, generating a delay command to increase or decrease the delay of the first data line; and
increasing or decreasing a delay of the second data line by a same delay as the first data line based on the delay command.

18. The method of claim 17 wherein the data strobe comprises a differential strobe signal.

19. The method of claim 18 further comprising generating a single ended signal based on the differential strobe signal, wherein the first data and the second data are each strobed using the single ended signal.

20. The method of claim 17 further comprising transmitting the first and the second strobed data to a memory controller.

* * * * *